United States Patent
D'Andrade et al.

(10) Patent No.: US 8,040,053 B2
(45) Date of Patent: Oct. 18, 2011

(54) ORGANIC LIGHT EMITTING DEVICE ARCHITECTURE FOR REDUCING THE NUMBER OF ORGANIC MATERIALS

(75) Inventors: Brian D'Andrade, Westampton, NJ (US); James Esler, Levittown, PA (US)

(73) Assignee: Universal Display Corporation, Ewing, NJ (US)

( * ) Notice: Subject to any disclaimer, the term of this patent is extended or adjusted under 35 U.S.C. 154(b) by 208 days.

(21) Appl. No.: 12/332,945

(22) Filed: Dec. 11, 2008

(65) Prior Publication Data
US 2009/0200927 A1    Aug. 13, 2009

Related U.S. Application Data

(60) Provisional application No. 61/065,131, filed on Feb. 9, 2008.

(51) Int. Cl.
*H01J 1/62*    (2006.01)
(52) U.S. Cl. .................................. 313/506; 428/690
(58) Field of Classification Search .......... 313/498–506; 428/690
See application file for complete search history.

(56) References Cited

U.S. PATENT DOCUMENTS

| | | | |
|---|---|---|---|
| 4,769,292 A | 9/1988 | Tang et al. |
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |

(Continued)

FOREIGN PATENT DOCUMENTS
EP    0650955    5/1995
(Continued)

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater.*, 6(9):677-679 (1994).

(Continued)

*Primary Examiner* — Peter Macchiarolo
(74) *Attorney, Agent, or Firm* — Kilpatrick Townsend Stockton LLP

(57) ABSTRACT

An organic light emitting device is provided. The device includes an anode and a cathode. A first emissive layer is disposed between the anode and the cathode. The first emissive layer includes a first non-emitting organic material, which is an organometallic material present in the first emissive layer in a concentration of at least 50 wt %. The first emissive layer also includes a first emitting organic material. A second emissive layer is disposed between the first emissive layer and the cathode, preferably, in direct contact with the first emissive layer. The second emissive material includes a second non-emitting organic material and a second emitting organic material. The first and second non-emitting materials, and the first and second emitting materials, are all different materials. A first non-emissive layer is disposed between the first emissive layer and the anode, and in direct contact with the first emissive layer. The first non-emissive layer comprises the first non-emissive organic material.

12 Claims, 3 Drawing Sheets

U.S. PATENT DOCUMENTS

| | | | |
|---|---|---|---|
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,687,266 B1 | 2/2004 | Ma et al. | |
| 6,835,469 B2 | 12/2004 | Kwong et al. | |
| 6,869,695 B2 | 3/2005 | Thompson et al. | |
| 7,009,338 B2 | 3/2006 | D'Andrade et al. | |
| 7,022,421 B2 | 4/2006 | Thompson et al. | |
| 7,078,113 B2 | 7/2006 | Thompson et al. | |
| 7,087,321 B2 | 8/2006 | Kwong et al. | |
| 7,151,339 B2 | 12/2006 | Adamovich et al. | |
| 7,279,704 B2 | 10/2007 | Walters et al. | |
| 7,285,907 B2 * | 10/2007 | D'Andrade et al. | 313/504 |
| 7,294,849 B2 | 11/2007 | Thompson et al. | |
| 7,431,968 B1 | 10/2008 | Shtein et al. | |
| 7,466,073 B2 * | 12/2008 | Kishino et al. | 313/504 |
| 7,611,779 B2 * | 11/2009 | Kanno et al. | 428/690 |
| 7,714,498 B2 * | 5/2010 | Aoyama et al. | 313/503 |
| 7,768,195 B2 * | 8/2010 | Jinde et al. | 313/504 |
| 7,862,906 B2 * | 1/2011 | Abe | 428/690 |
| 7,871,711 B2 * | 1/2011 | Itai | 428/690 |
| 2002/0034656 A1 | 3/2002 | Thompson et al. | |
| 2002/0134984 A1 | 9/2002 | Igarashi | |
| 2003/0175553 A1 | 9/2003 | Thompson et al. | |
| 2003/0230980 A1 | 12/2003 | Forrest et al. | |
| 2004/0174116 A1 | 9/2004 | Lu et al. | |
| 2005/0025993 A1 | 2/2005 | Thompson et al. | |
| 2005/0046337 A1 * | 3/2005 | Chin et al. | 313/504 |
| 2005/0074630 A1 | 4/2005 | Kanno et al. | |
| 2005/0077817 A1 * | 4/2005 | Yamazaki et al. | 313/504 |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0046098 A1 | 3/2006 | Hosokawa | |
| 2006/0125380 A1 * | 6/2006 | Nagara et al. | 313/504 |
| 2006/0141288 A1 | 6/2006 | Matsuura et al. | |
| 2006/0202194 A1 | 9/2006 | Jeong et al. | |
| 2006/0232194 A1 | 10/2006 | Tung et al. | |
| 2006/0251923 A1 | 11/2006 | Lin et al. | |
| 2007/0190359 A1 | 8/2007 | Knowles et al. | |

FOREIGN PATENT DOCUMENTS

| | | |
|---|---|---|
| EP | 1589789 | 10/2005 |
| EP | 1670082 | 6/2006 |
| JP | 2003229272 | 8/2003 |
| JP | 200511610 | 1/2005 |
| JP | 2005038672 | 2/2005 |
| JP | 2007123392 | 5/2007 |
| JP | 2007254297 | 10/2007 |
| WO | WO 0139234 | 5/2001 |
| WO | WO 0202714 | 1/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006082742 | 8/2006 |
| WO | WO 2006098120 | 9/2006 |
| WO | WO 2006103874 | 10/2006 |
| WO | WO 2006114966 | 11/2006 |
| WO | WO 2006132173 | 12/2006 |
| WO | WO 2007004380 | 1/2007 |
| WO | WO 2007063754 | 6/2007 |
| WO | WO 2007063796 | 6/2007 |
| WO | WO 2009/030981 | 3/2009 |
| WO | WO 2010/028262 | 3/2010 |

OTHER PUBLICATIONS

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral $Ru^{II}$ PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. and VanSlyke, S.A., "Organic Electroluminescent Diodes," *Appl. Phys. Lett.*, 51(12):913-915 (1987).

Adachi, Chihaya et al., "Organic Electroluminescent Device Having a Hole Conductor as an Emitting Layer," *Appl. Phys. Lett.*, 55(15):1489-1491 (1989).

Ma, Yuguang et al., "Triplet Luminescent Dinuclear-Gold(*I*) Complex-Based Light-Emitting Diodes with Low Turn-On voltage," *Appl. Phys. Lett.*, 74(10):1361-1363 (1999).

Gao, Zhiqiang et al., "Bright-Blue Electroluminescence From a Silyl-Substituted ter-(phenylene-vinylene) derivative," *Appl. Phys. Lett.*, 74(6):865- 867 (1999).

Baldo, M.A. et al., "Very High-Efficiency Green Organic Light-Emitting Devices Based on Electrophosphorescence," *Appl. Phys. Lett.*, 75(1):4-6 (1999).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic Light-Emitting Diodes with Phosphorescent Platinum Complexes Containing N^C^N-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film.Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emitting Devices with Tunable Colour,*Chem. Commun.*, 2906-2908 (2005).

Hamada,Yuji et al., "High Luminance in Organic Electroluminescent Devices with Bis(10-hydroxybenzo[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota,Yasuhiko, "5,5'-Bis(dimesitylboryl)-2,2'-bithiophene and 5,5" -Bis(dimesitylboryl)-2,2':5',2"-terthiophene as a Novel Family of Electron-Transporting Amorphous Molecular Materials," *J. Am. Chem. Soc.*, 120 (37):9714-9715 (1998).

Sakamoto,Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15 ):2160-2162 (1996).

Baldo, M. A. et al., "Highly Efficient Phosphorescent Emission From Organic Electroluminescent Devices," *Nature*, 395:151-154 (1998).

Guo, Tzung-Fang et al., "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergard et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

U.S. Appl. No. 61/065,131, filed Feb. 9, 2008.

U.S. Appl. No. 10/233,470, filed Sep. 4, 2002.

International Search Report in the corresponding PCT application No. PCT/US2009/030545, (2009).

"Inorganic Chemistry" (2nd Edition) by Gary L. Miessler and Donald A. Tarr, Pentice-Hall, pp. 1-3; 422-424 (1998).

Baldo et al., "Highly Efficient Phosphorescent Emission from Organic Electroluminescent Devices," Nature, vol. 395, 151-154, 1998; ("Baldo-I").

Baldo et al., "Very high-efficiency green organic light-emitting devices based on electrophosphorescence," *Appl. Phys. Lett.*, vol. 75, No. 3, 4-6 (1999) ("Baldo-II").

B. W. D'Andrade, J.-Y. Tsai, C. Lin, M. S. Weaver, P. B. Mackenzie, and J. J. Brown, *Efficient white phosphorescent organic light-Emitting devices*, Long Beach, CA, United States, 2007 (Society for Information Display, San Jose, CA 95112-4006, United States), p. 1026-1029.

B. D'Andrade, M. S. Weaver, and J. J. Brown, *White phosphorescent organic light emitting devices*, SPIE 6655, 6332-6334 (2007).

B. W. D'Andrade, R. J. Holmes, and S. R. Forrest, *Efficient organic electrophosphorescent white-light-emitting device with a triple doped emissive layer*, Advanced Materials 16, 624-628 (2004).

[4]B. W. D'Andrade and S. R. Forrest, *White organic light-emitting devices for.solid-state lighting*, Advanced Materials 16, 1585-1595 (2004).

B. W. D'Andrade, J. Brooks, V. Adamovich, M. E. Thompson, and S. R. Forrest, *White light emission using triplet excimers in electrophosphorescent organic light-emitting devices*, Advanced Materials 14, 1032-1036 (2002).

Adamovich, J. Brooks, a. Tamayo, A. M. Alexander, P. I. Djurovich, B. W. D'Andrade, C. Adachi, S. R. Forrest, and M. E. Thompson, *High efficiency single dopant white electrophosphorescent light emitting diodes*, New Journal of Chemistry 26, 1171-1178 (2002).

Vadim Adamovich, "*Novel materials and techniques of fabrication for organic light emitting diodes*." PhD Thesis. Published Nov. 25, 2003.

The Search Report corresponding to the PCT/US2009/056066 application.

Tanaka et al.: "High Luminous Efficiency Blue Organic Light-Emitting Devices Using high Triplet Excited Energy Materials" Japanese Journal of Applied Physics, Japan Society of Applied Physics, Tokyo,JP, vol. 46, No. 4-7, Feb. 1, 2007, pp. L117- L119.

Kyung Soo Son et al.: "Blue organic electrophosphorescence diodes using diarylamino-substituted heterocyclic compounds as host material" Journal of Photopolymer Science and Technology, vol. 20, No. 1, 2007, pp. 47-51.

Adamovich V I et al., "Improving the performance of PHOLEDs by using dual doping" Proc. of Spie, vol. 7051, Aug. 26, 2008, pp. 70510D-1-70510D-8.

Holmes R et al.: "Saturated deep blue organic electrophosphorescence using a fluorine-free emitter" Applied Physics Letters, AIP, American Institute of Physics, Melville, NY, US, vol. 87, No. 24, 7 Dec. 2005, pp. 243507-243507.

Park Y R at al.: "Organic light-emitting devices with In-doped (4 at. %) ZnO thin films as the anodic electrode" Japanese Journal of Applied Physics, Japan Society of Applied Physics, Tokyo, JP, vol. 47, No. 1, Jan. 1, 2008, pp. 468-471.

Dodabalapur et al, "Physics and applications of organic microcavity light emitting diodes," J. Appl. Phys. 80 (12), Dec. 15, 1996.

So et al., "Bipolar Carder Transport in Organic Small Molecules for OLED," Proceedings of the Society for Information Display. 38, 1497 (2007).

The International Search Report and Written Opinion corresponding to the PCT/IB2007/004687 application mailed May 7, 2009.

Baldo et al., "High-efficiency fluorescent organic light-emitting devices using a phosphorescent sensitizer", Nature, Nature Publishing Group, London, UK, vol. 403, Feb. 17, 2000, pp. 750-753.

E. E. Namdas, T.D.Anthopoulos, l.D.W.Samuel, Applied Physics Letters 86, 161104 (2005).

T.D.Anthopoulos, M.J.Frampton, E.B.Namdas, P.L.Burn, I.D.W. Samuel, Adv. Mater.2004, 16, No. 6, Mar. 18, pp. 557-560.

U.S. Appl. No. 61/094,145, filed Sep. 4, 2008.

U.S. Appl. No. 60/763,189 filed Jan. 27, 2006.

\* cited by examiner

ORGANIC LIGHT EMITTING DEVICE ARCHITECTURE FOR REDUCING THE NUMBER OF ORGANIC MATERIALS

This application claims priority to U.S. Provisional Application No. 61/065,131, filed on Feb. 9, 2008, which is incorporated by reference in its entirety.

The invention was made with government support under Federal Contract Grants: Department of Energy DE FG02-06ER84582 and DE-FG02-05ER84263. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to an architecture for organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entireties.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the structure of Formula I:

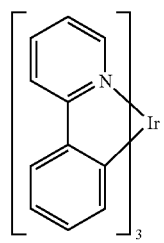

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The term "organometallic" as used herein is as generally understood by one of ordinary skill in the art and as given, for example, in "Inorganic Chemistry" (2nd Edition) by Gary L. Miessler and Donald A. Tarr, Pentice-Hall (1998). Thus, the term organometallic refers to compounds which have an organic group bonded to a metal through a carbon-metal bond. This class does not include per se coordination compounds, which are substances having only donor bonds from heteroatoms, such as metal complexes of anines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN.

More details on OLEDs, and the definitions described above, can be found in U.S. Pat. No. 7,279,704, which is incorporated herein by reference in its entirety.

SUMMARY OF THE INVENTION

An organic light emitting device is provided. The device includes an anode and a cathode. A first emissive layer is disposed between the anode and the cathode. The first emissive layer includes a first non-emitting organic material, which is an organometallic material present in the first emissive layer in a concentration of at least 50 wt %. The first non-emitting material may be present in concentrations of almost 100 wt %, although the presence of the first emitting organic material prevents the concentration of the first non-emitting material from reaching 100 wt %. The first emissive layer also includes a first emitting organic material. Preferably, the concentration of the first emitting organic material is 0.1-6 wt %, more preferably 0.1-3 wt %, although other concentrations may be used. Other materials may also be present in the first emissive layer, but in one embodiment, only the first non-emitting material and the first emitting material are present. A second emissive layer is disposed between the first emissive layer and the cathode. Preferably, the second emissive layer is in direct contact with the first emissive layer. The second emissive material includes a second non-emitting organic material, which is preferably present in a concentration of at least 50 wt %. The second non-emitting material may be present in concentrations of almost 100 wt %, although the presence of the second emitting organic material prevents the concentration from reaching 100 wt %. The second emissive layer also includes a second emitting organic material. Preferably, the concentration of the second emitting organic material is 0.1-6 wt %, more preferably 0.1-3 wt %, although other concentrations may be used. Other materials may also be present in the second emissive layer, but in one embodiment, only the second non-emitting material and the second emitting material are present. The first and second non-emitting materials, and the first and second emitting materials, are all different materials. A first non-emissive layer is disposed between the first emissive layer and the anode, and in direct contact with the first emissive layer. The first non-emissive layer comprises the first non-emissive organic material. The first non-emissive layer may consist essentially of the first non-emitting material.

Preferably, but not necessarily, the device also includes a second non-emissive layer disposed between the second emissive layer and the cathode, and in direct contact with the second emissive layer. The second non-emissive layer comprises the second non-emitting organic material. The second non-emissive layer may consist essentially of the second non-emitting material.

Preferably, the first and second emitting organic materials are phosphorescent materials.

Preferably, the first emissive layer consists essentially of the first non-emitting organic material and the first emitting organic material, the first non-emissive layer consists essentially of the first non-emitting organic material, the second emissive layer consists essentially of the second non-emitting organic material and the second emitting organic material, and the second non-emissive layer consists essentially of the second non-emitting organic material. As used herein, and consistent with patent drafting conventions generally, the term "comprising" is open-ended and allows for the presence of other materials, whereas the term "consisting essentially of" is close-ended, and does not allow the presence of other materials that significantly affect device performance, although some level of impurity that does not have a significant affect on device performance may be allowed.

Preferably, the device also includes a third non-emissive layer disposed between the second non-emissive layer and the cathode. Preferably, the third non-emissive layer is in direct contact with both the second non-emissive layer and the cathode. The third non-emissive layer comprises a third non-emitting material. Preferably, the third non-emissive layer consists essentially of a third non-emitting material.

Preferably, the first non-emissive layer is in direct contact with the anode.

In a preferred embodiment, the device consists essentially of the anode, the cathode, the first and second emitting materials, and the first, second and third non-emitting materials, and includes only the first non-emissive, first emissive, second non-emissive, second emissive, and third non-emissive layers as described above. Such a device architecture is highly simplified, with only 5 organic materials used in the device. The materials costs and manufacturing complexity will be lower for devices with as few organic materials as possible.

The second emissive layer may also comprise a fourth non-emitting material.

In one embodiment, the first emitting material has a peak emissive wavelength in the visible spectrum of 500-700 nm, and the second emitting material has a peak emissive wavelength in the visible spectrum of 400-500 nm.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
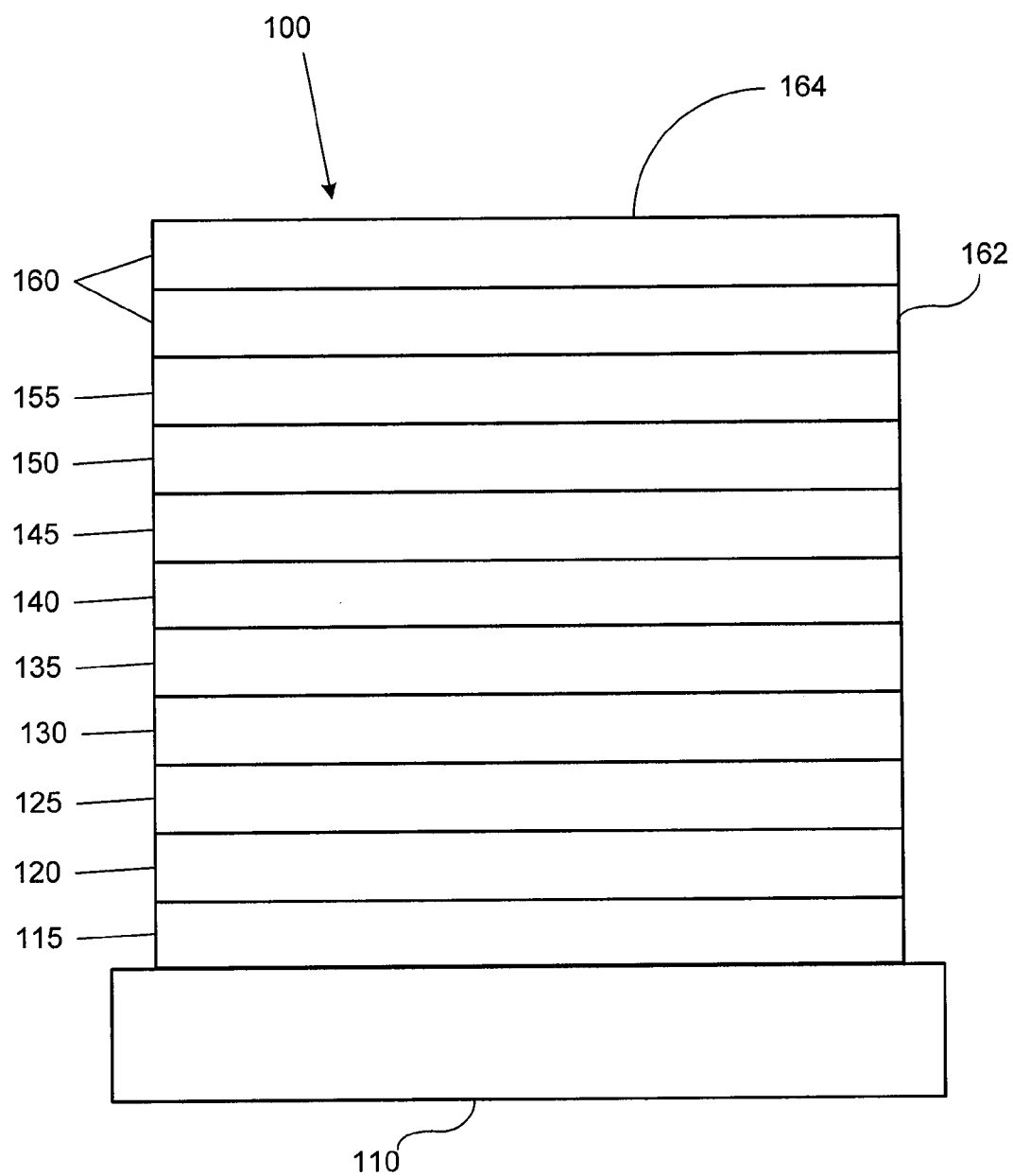
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
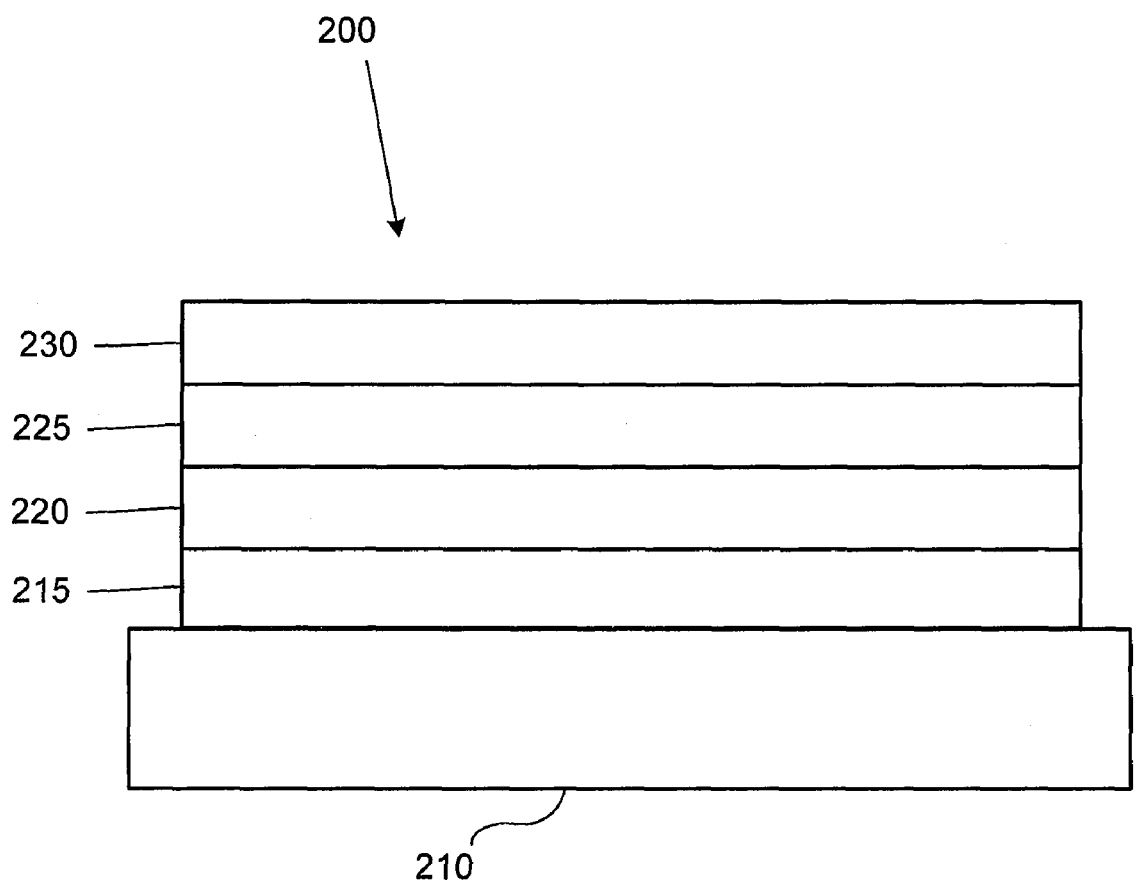
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, inkjet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

An organic light emitting device is provided. The device includes an anode and a cathode.

A first emissive layer is disposed between the anode and the cathode. The first emissive layer includes a first non-emitting organic material, which is an organometallic material present in the first emissive layer in a concentration of at least 50 wt %. The first non-emitting material may be present in concentrations of almost 100 wt %, although the presence of the first emitting organic material prevents the concentration of the first non-emitting material from reaching 100 wt %. The first emissive layer also includes a first emitting organic material. Preferably, the concentration of the first emitting organic material is 0.1-6 wt %, more preferably 0.1-3 wt %, although other concentrations may be used. Other materials may also be present in the first emissive layer, but in one embodiment, only the first non-emitting material and the first emitting material are present.

A second emissive layer is disposed between the first emissive layer and the cathode. Preferably, the second emissive layer is in direct contact with the first emissive layer. The second emissive material includes a second non-emitting organic material, which is preferably present in a concentration of at least 50 wt %. The second non-emitting material may be present in concentrations of almost 100 wt %, although the presence of the second emitting organic material prevents the concentration from reaching 100 wt %. The second emissive layer also includes a second emitting organic material. Preferably, the concentration of the second emitting organic material is 0.1-6 wt %, more preferably 0.1-3 wt %, although other concentrations may be used. Other materials may also be present in the second emissive layer, but in one embodiment, only the second non-emitting material and the second emitting material are present.

The first and second non-emitting materials, and the first and second emitting materials, are all different materials.

As used herein, the term "emitting" and "non-emitting" material refers to whether a material emits light in the particular device architecture in which it is present. A material that is "non-emitting" in a particular device architecture may be emitting in other contexts. For example, a high triplet energy phosphorescent material, such as a blue emitter, may be present in an emissive layer of a device but be "non-emitting" due to the presence of other materials, such as a lower triplet energy material, perhaps a red emitter.

A first non-emissive layer is disposed between the first emissive layer and the anode, and in direct contact with the first emissive layer. The first non-emissive layer comprises the first non-emissive organic material. The first non-emissive layer may consist essentially of the first non-emitting material. Experimental results show that the use of a first non-emissive layer comprising a first non-emitting material, which is also used in an adjacent emissive layer comprising the first non-emitting material and a first emitting material, as in Device No. 25, may provide superior efficiency as compared to an otherwise identical device that uses a common hole-injection/hole transport material selection (Device No. 26). In addition, the use of a common material in these layers reduces the number of organic materials in the device, which reduces fabrication complexity and cost. Normally, it might be expected that reducing the options available for material selection might lead to tradeoffs, but using a first non-emitting material, which is organometallic, in both the first non-emissive layer and the first emissive layer unexpectedly leads to higher efficiency.

Preferably, but not necessarily, the device also includes a second non-emissive layer disposed between the second emissive layer and the cathode, and in direct contact with the second emissive layer. The second non-emissive layer comprises the second non-emitting organic material. The second non-emissive layer may consist essentially of the second non-emitting material. Devices including the second non-emissive layer using the same non-emitting material as the second emissive layer were observed to have unexpectedly superior performance, including high device efficiency, relative to similar devices not having the second non-emissive layer.

Preferably, the first and second emitting organic materials are phosphorescent materials.

Preferably, the first emissive layer consists essentially of the first non-emitting organic material and the first emitting organic material, the first non-emissive layer consists essentially of the first non-emitting organic material, the second emissive layer consists essentially of the second non-emitting organic material and the second emitting organic material, and the second non-emissive layer consists essentially of the second non-emitting organic material. As used herein, and consistent with patent drafting conventions generally, the term "comprising" is open-ended and allows for the presence of other materials, whereas the term "consisting essentially of" is close-ended, and does not allow the presence of other materials that significantly affect device performance, although some level of impurity that does not have a significant affect on device performance may be allowed.

Preferably, the device also includes a third non-emissive layer disposed between the second non-emissive layer and the cathode. Preferably, the third non-emissive layer is in direct contact with both the second non-emissive layer and the cathode. The third non-emissive layer comprises a third non-emitting material. Preferably, the third non-emissive layer consists essentially of a third non-emitting material.

Preferably, the first non-emissive layer is in direct contact with the anode.

In a preferred embodiment, the device consists essentially of the anode, the cathode, the first and second emitting materials, and the first, second and third non-emitting materials, and includes only the first non-emissive, first emissive, second non-emissive, second emissive, and third non-emissive layers as described above. Such a device architecture is highly simplified, with only 5 organic materials used in the device. The materials costs and manufacturing complexity will be lower for devices with as few organic materials as possible.

The second emissive layer may also comprise a fourth non-emitting material.

One challenge facing white organic light emitting device (WOLED) technology is the fact that fluorescent or phosphorescent emission from any given typical organic material only spans about one-third of the visible spectrum. Therefore, two or more emitters may be incorporated into a single device in order to sufficiently span the visible spectrum to obtain a white OLED. The complexity of WOLED architectures almost dictates that the number of materials required for a WOLED exceed the number required for a monochromatic OLED. However, in some embodiments, WOLED architectures are disclosed herein that use as few materials as possible. One material may serve a dual purpose as a hole injection layer and as an emissive layer host, and another material is shown to perform as both an emissive layer host and as a blocking layer. A minimalist WOLED containing only 5 organic materials is an exemplary device with few organic materials and good operational performance characteristics.

Preferably, the first emitting material has a peak emissive wavelength in the visible spectrum of 500-700 nm, and the second emitting material has a peak emissive wavelength in the visible spectrum of 400-500 nm. This combination may allow for devices emitting light having desirable CIE coordinates.

Figure 3:
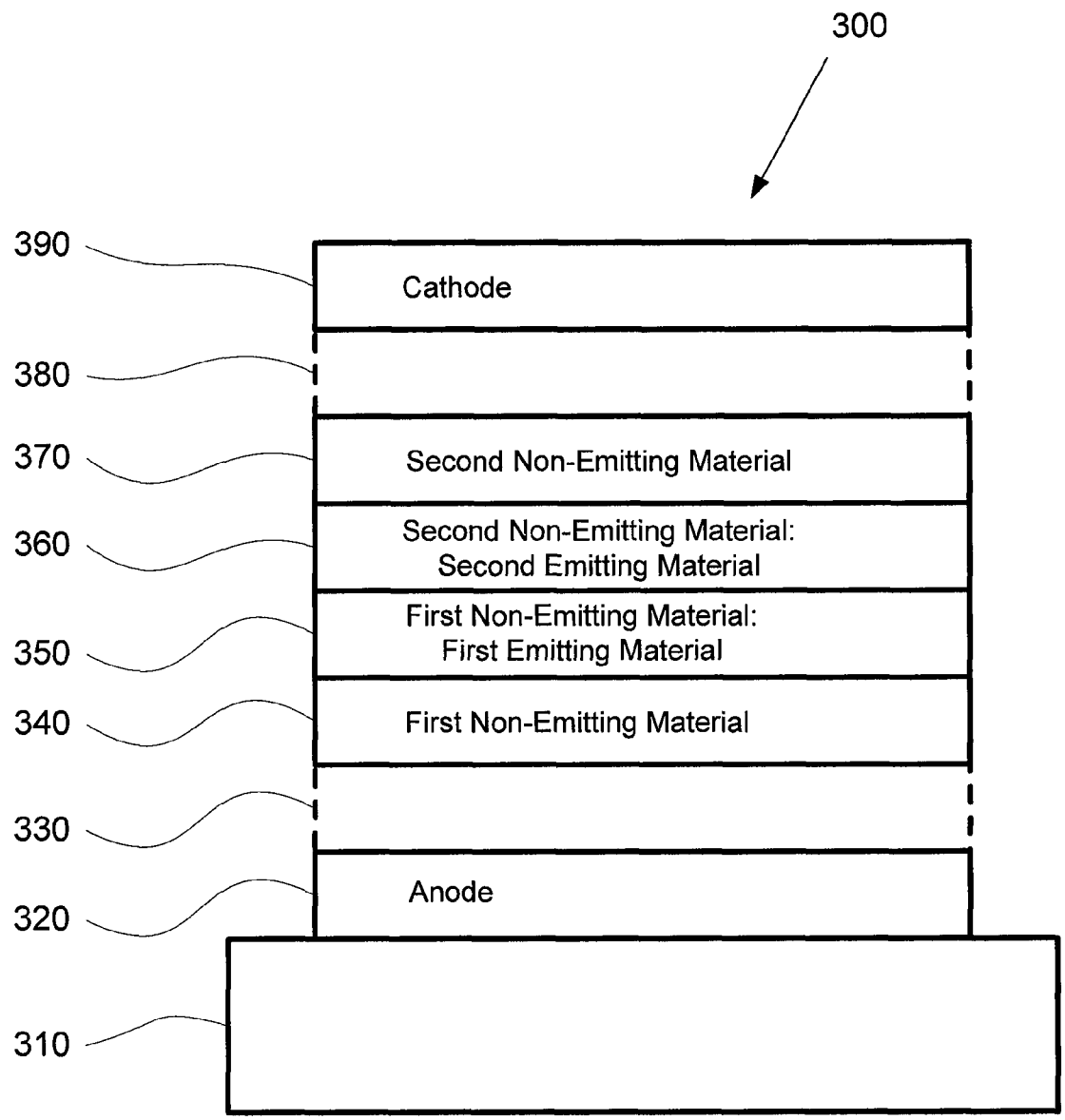
FIG. 3 shows an organic light emitting device having a particular architecture.

FIG. 3 shows an exemplary device. Device 300 is disposed on a substrate 310. Device 300 includes an anode 320, a first non-emissive layer 340, a first emissive layer 350, a second emissive layer 360, a second non-emissive layer 370, and a cathode 390, disposed in that order over substrate 310. Device 300 may optionally include other layers, as illustrated by layer 330 and layer 380, which may or may not be present, and which may each represent multiple layers. In a preferred embodiment, layer 330 is not present, and layer 380 represents a single layer that transports electrons.

Anode 320 and cathode 390 may be made of any suitable electrode materials.

First non-emissive layer 340 comprises, and preferably consists essentially of, a first non-emitting organic material. First emissive layer 350 comprises, and preferably consists essentially of, the first non-emitting organic material as well as a first emitting organic material. The first non-emitting organic material is preferably an organometallic material. Second non-emissive layer 370 comprises, and preferably consists essentially of, a second non-emitting organic material. Second emissive layer 360 comprises, and preferably consists essentially of, the second non-emitting organic material as well as a second emitting organic material.

The configuration of first non-emissive layer 340, first emissive layer 350, second emissive layer 360, and second non-emissive layer 370 provides several advantages.

The use of first non-emitting organic material in both first non-emissive layer 340 and first emissive layer 350 allows a single organic material to serve as a hole injection material and as a host in an emissive layer. Also, the use of the first non-emitting organic material in this way ensures smooth hole injection, i.e., with a minimal injection barrier, from first non-emissive layer 340 into first emissive layer 350. Organometallic materials are preferred for use as the first non-emitting material due to their combination of good hole transport properties, and a wide variety of orbital energy levels and band gaps from which to select.

The use of second non-emitting organic material in both second non-emissive layer 370 and second emissive layer 360 allows a single organic material to serve as an emissive layer host and as an exciton/hole blocking layer, simplifying device fabrication. Also, the use of the second non-emitting organic material in this way enhances smooth electron injection, i.e., with a minimal injection barrier, from second non-emissive layer 370 into second emissive layer 360. Organic materials that include at least one carbazole, dibenzothiophene, or triphenyl group are preferred for use as the second non-emitting organic material due to the high triplet energy and good electron transport properties of these materials, although a wide variety of other organic materials may also be used.

The interface between first emissive layer 350 and second emissive layer 360, and differences in the charge carrier transport properties of the different organic materials in those layers, provides a plane in the device where recombination may occur in proximity to both the first and second emitting organic materials. This difference in transport properties at the interface of first emissive layer 350 and second emissive layer 360 is reinforced by the similarities in transport properties of the organic materials present at the interface of first non-emissive layer 340 and first emissive layer 350, and at the interface of second non-emissive layer 370 and second emissive layer 360, due to the presence of organic materials common to those layers, i.e., the first non-emitting organic material in both first non-emissive layer 340 and first emissive layer 350, and the second non-emitting organic material in both second non-emissive layer 370 and second emissive layer 360.

In a preferred embodiment, layer 330 is not present, and layer 380 represents a single layer that transports electrons. This configuration, in conjunction with a first non-emissive layer 340 that consists essentially of a first non-emitting organic material, a first emissive layer 350 that consists essentially of the first non-emitting organic material as well as a first emitting organic material, a second non-emissive layer 370 that consists essentially of a second non-emitting organic material, and a second emissive layer 360 that consists essentially of the second non-emitting organic material as well as a second emitting organic material provides several advantages. First, such a device includes 2 different emitting organic materials, while using only 5 different organic materials. The presence of 2 different organic emitters allows for the creation of a white OLED. The use of only 5 different organic materials simplifies fabrication and reduces demands placed upon fabrication equipment. Many organometallic materials readily accept holes from an anode, so layer 330 may be omitted in many device architectures, favorably simplifying device fabrication. However, many preferred second non-emitting organic materials may not as readily accept electrons injected from a cathode, so an additional layer 380 may be preferred to accept electrons injected from the cathode, and transport the electrons to second non-emissive layer 370. LG201 is a preferred material for use in layer 380, although a wide variety of other organic materials that accept electrons from a cathode and inject them into the remainder of the device may be used.

As used herein, the following letter designations refer to compounds as follows:

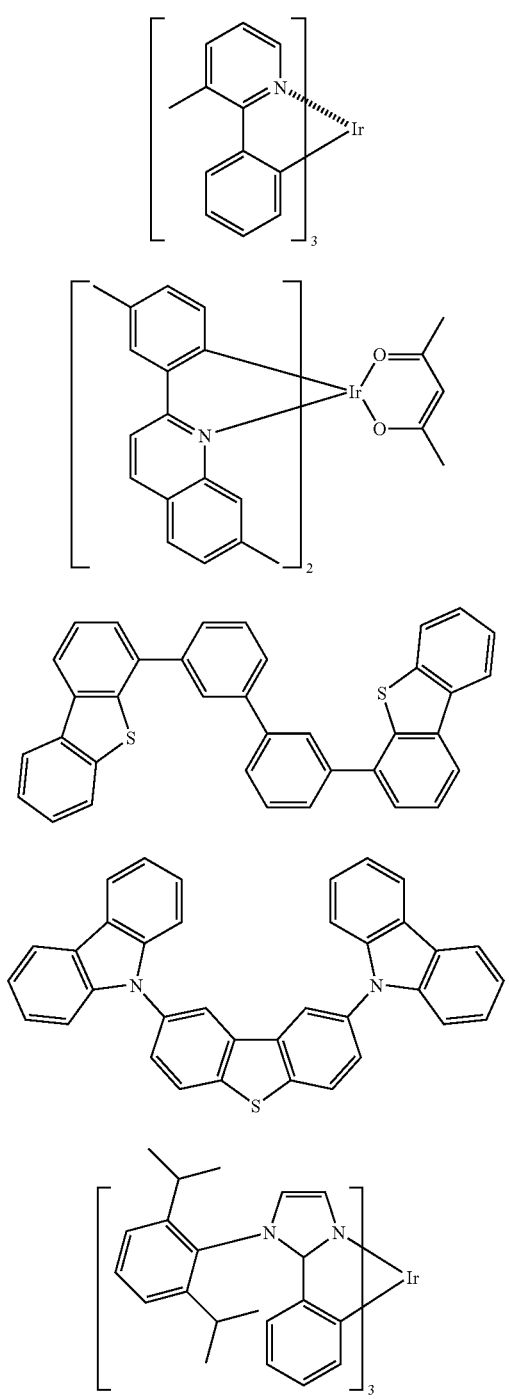

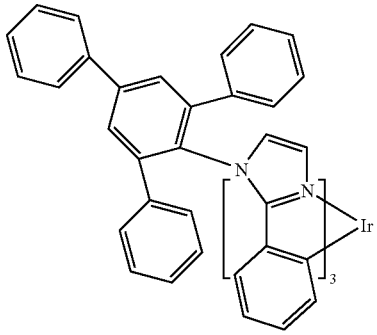

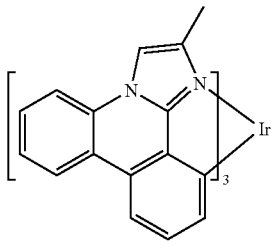

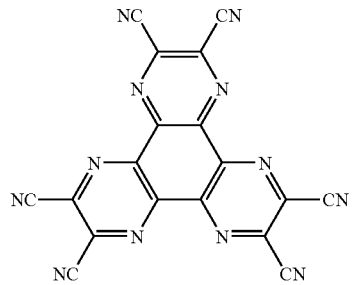

Compounds A and B are an example of a suitable pair of first non-emitting material and first emitting material, respectively. Compounds C and E are an example of a suitable pair of second non-emitting material and second emitting material, respectively. Compounds C and F are another example of a suitable pair of second non-emitting material and second emitting material, respectively. Compounds D and F are another example of a suitable pair of second non-emitting material and second emitting material, respectively. Compound G is used as an emitting material in the examples, and Compound H is used as a hole injection material in the examples. mCBP refers to 3,3'-bis(N-carbazolyl)biphenyl, and NPD refers to 4,4'-bis[N-(1-naphthyl)-N-phenylamino]biphenyl.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| Hole injection materials | | |
| Phthalocyanine and porphryin compounds | 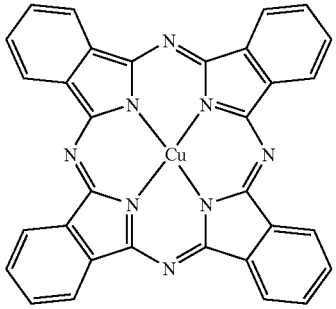 | Appl. Phys. Lett. 69, 2160 (1996) |
| Starburst triarylamines | 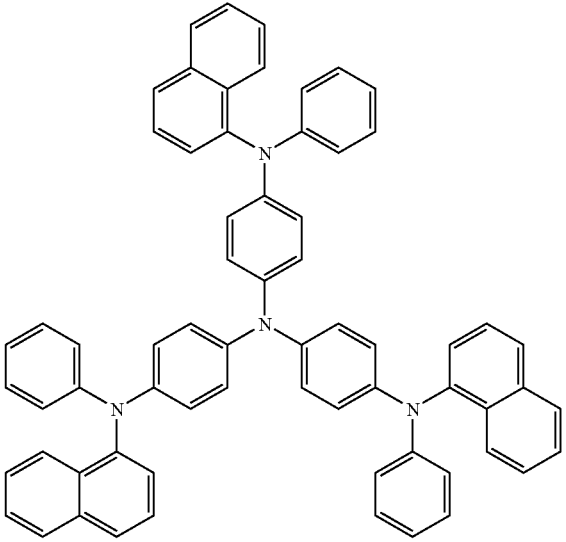 | J. Lumin. 72-74, 985 (1997) |
| $CF_x$ Fluorohydrocarbon polymer | $-\!\!\!+\!CH_xF_y\!\!+\!\!\!-_n$ | Appl. Phys. Lett. 78, 673 (2001) |
| Conducting polymers (e.g., PEDOT:PSS, polyaniline, polypthiophene) | 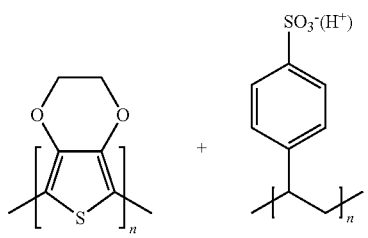 | Synth. Met. 87, 171 (1997) |
| Arylamines complexed with metal oxides such as molybdenum and tungsten oxides | 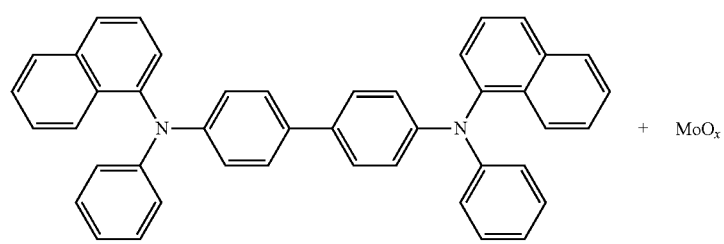   + $MoO_x$ | SID Symposium Digest, 37, 923 (2006) |

TABLE 1-continued
| MATERIAL | EXAMPLES OF MATERIAL | PUBLICATIONS |
|---|---|---|
| Hole transporting materials | | |
| Triarylamines (e.g., TPD, α-NPD) | 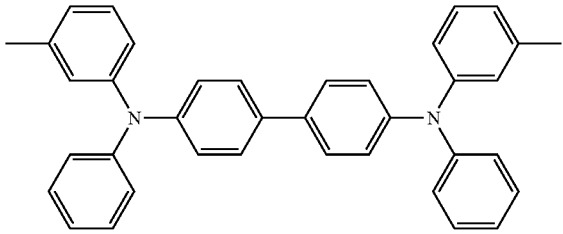 | Appl. Phys. Lett. 51, 913 (1987) |
| | 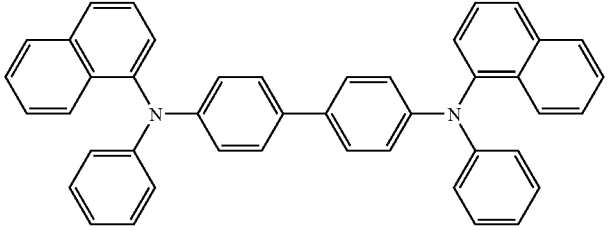 | US5061569 |
| | 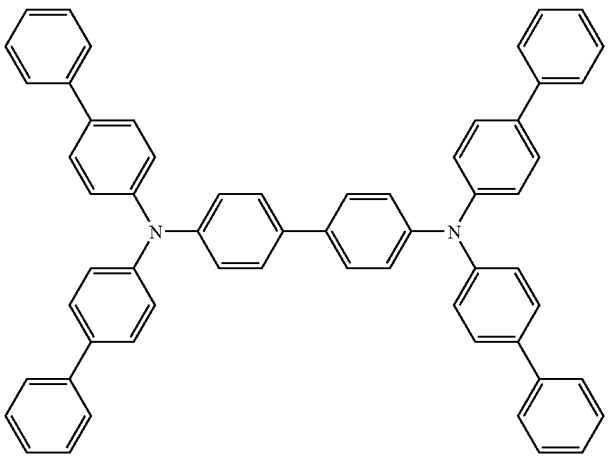 | EP650955 |
| | 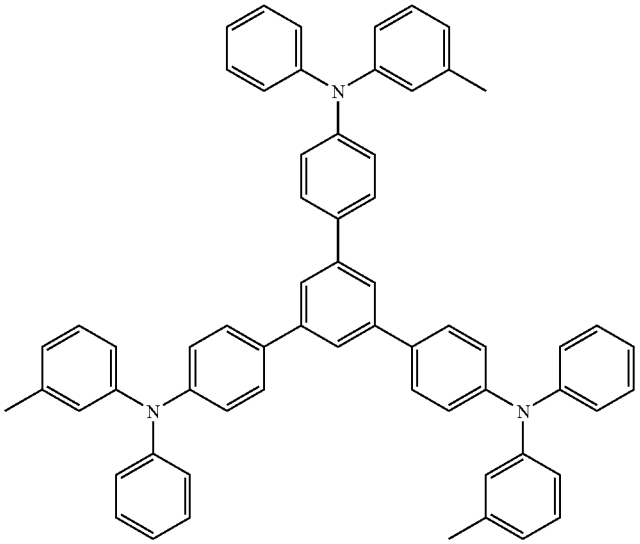 | J. Mater. Chem. 3, 319 (1993) |

TABLE 1-continued
| MATERIAL | EXAMPLES OF MATERIAL | PUBLICATIONS |
|---|---|---|
|  | 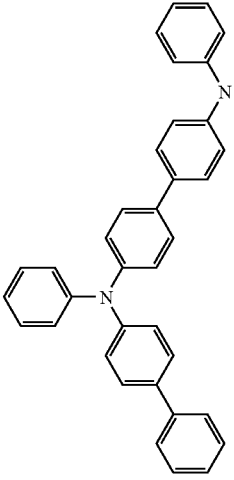 | Appl. Phys. Lett. 90, 183503 (2007) |
|  | 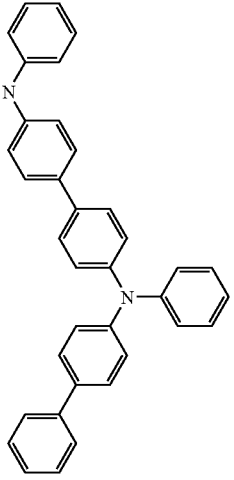 | Appl. Phys. Lett. 90, 183503 (2007) |
| Triaylamine on spirofluorene core | 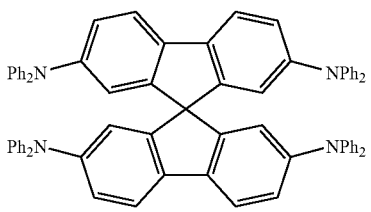 | Synth. Met. 91, 209 (1997) |

TABLE 1-continued

| MATERIAL | EXAMPLES OF MATERIAL | PUBLICATIONS |
| --- | --- | --- |
| Arylamine carbazole compounds | | Adv. Mater. 6, 677 (1994) |
| Indolocarbazoles | | Synth. Met. 111, 421 (2000) |
| Isoindole compounds | | Chem. Mater. 15, 3148 (2003) |

TABLE 1-continued

| MATERIAL | EXAMPLES OF MATERIAL | PUBLICATIONS |
| --- | --- | --- |
| Phosphorescent OLED host materials Red hosts | | |
| Arylcarbazoles | | Appl. Phys. Lett. 78, 1622 (2001) |
| Metal 8-hydroxyquinolates (e.g., $Alq_3$, BAlq) | | Nature 395, 151 (1998) |
| | | US20060202194 |
| | | WO2005014551 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |

TABLE 1-continued
| MATERIAL | EXAMPLES OF MATERIAL | PUBLICATIONS |
|---|---|---|
| Green hosts | | |
| Arylcarbazoles | 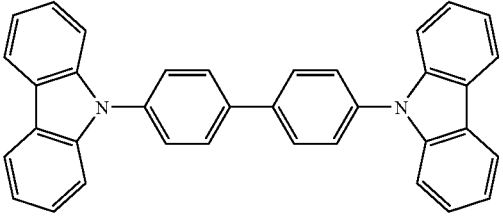 | Appl. Phys. Lett. 78, 1622 (2001) |
| | 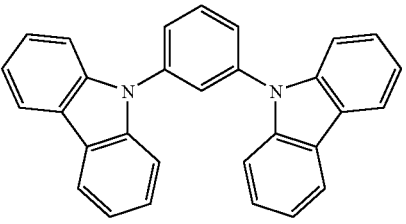 | US2003175553 |
| | 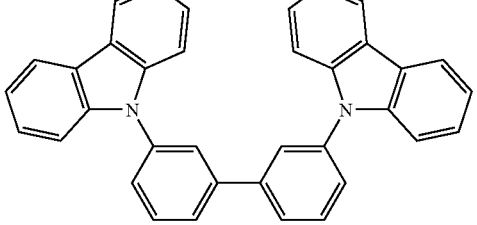 | WO2001039234 |
| Aryltriphenylene compounds | 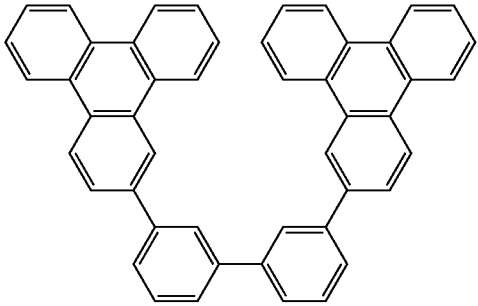 | US20060280965 |
| | 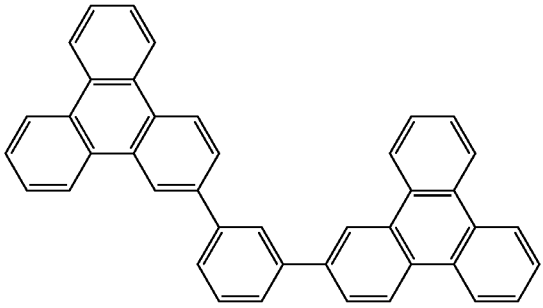 | US20060280965 |
| Polymers (e.g., PVK) | 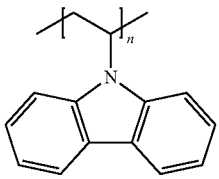 | Appl. Phys. Lett. 77, 2280 (2000) |

TABLE 1-continued

| MATERIAL | EXAMPLES OF MATERIAL | PUBLICATIONS |
| --- | --- | --- |
| Spirofluorene compounds | | WO2004093207 |
| Metal phenoxybenzooxazole compounds | | WO05089025 |
| | | WO06132173 |
| | | JP200511610 |
| Spirofluorene-carbazole compounds | | JP2007254297 |

TABLE 1-continued
| MATERIAL | EXAMPLES OF MATERIAL | PUBLICATIONS |
|---|---|---|
| | 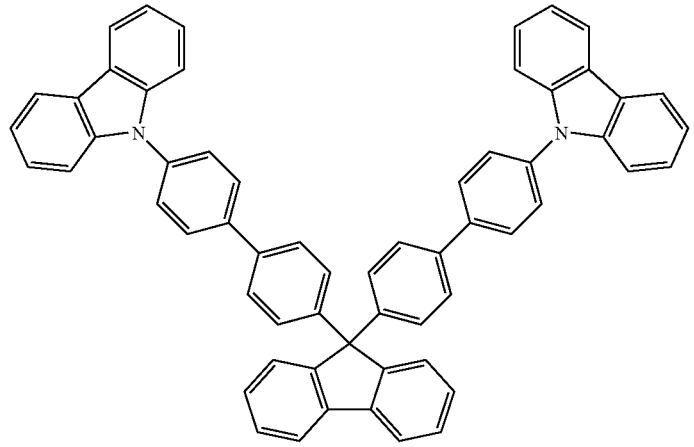 | JP2007254297 |
| Indolocabazoles | 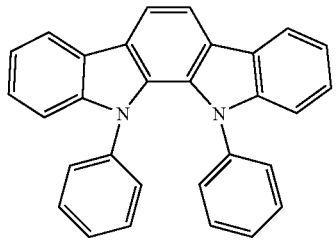 | WO07063796 |
| | 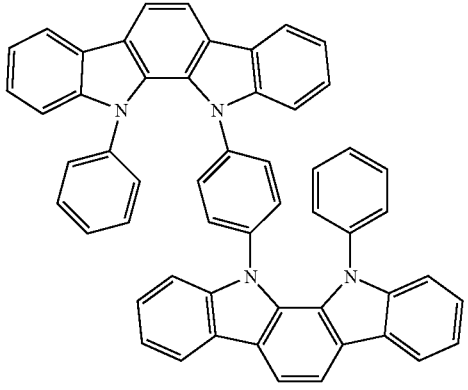 | WO07063754 |
| 5-member ring electron deficient heterocycles (e.g., triazole, oxadiazole) | 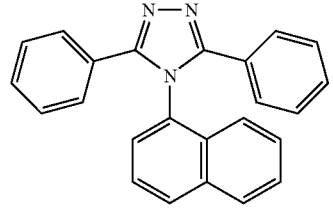 | J. Appl. Phys. 90, 5048 (2001) |
| | 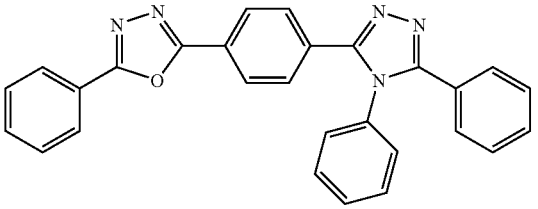 | WO04107822 |

TABLE 1-continued
| MATERIAL | EXAMPLES OF MATERIAL | PUBLICATIONS |
|---|---|---|
| Metal phenoxypyridine compounds | 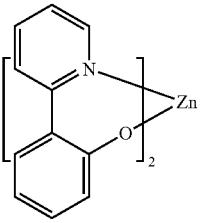 | WO05030900 |
| Blue hosts | | |
| Arylcarbazoles | 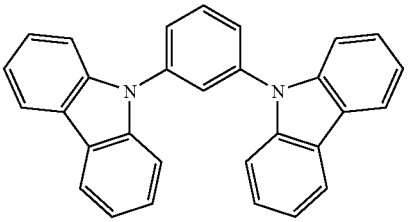 | Appl. Phys. Lett, 82, 2422 (2003) |
| | 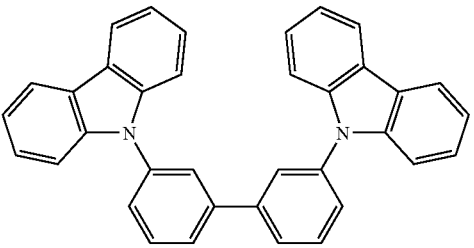 | US20070190359 |
| Dibenzothiophene-carbazole compounds | 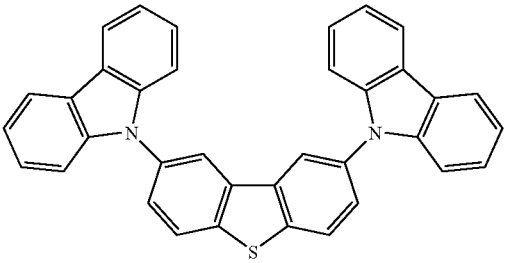 | WO2006114966 |
| Phosphorescent dopants | | |
| Red dopants | | |
| Heavy metal porphyrins (e.g., PtOEP) | 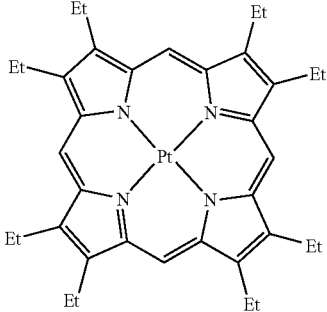 | Nature 395, 151 (1998) |

TABLE 1-continued

| MATERIAL | EXAMPLES OF MATERIAL | PUBLICATIONS |
|---|---|---|
| Iridium(III) organometallic complexes | | Appl. Phys. Lett. 78, 1622 (2001) |
| | | US06835469 |
| | | US06835469 |
| | | US20060202194 |
| | | US20060202194 |

TABLE 1-continued

| MATERIAL | EXAMPLES OF MATERIAL | PUBLICATIONS |
|---|---|---|
| | [Ir complex with methyl-substituted phenylquinoline ligand]$_3$ | US07087321 |
| | [Ir complex with phenylisoquinoline ligand]$_3$ | US07087321 |
| | [Ir complex with phenylisoquinoline ligand bearing $H_{17}C_8$ substituent]$_3$ | Adv. Mater. 19, 739 (2007) |
| Platinum(II) organometallic complexes | Pt complex with phenylisoquinoline and acetylacetonate ligands | WO2003040257 |
| Osminum(III) complexes | [Os(PPhMe$_2$)$_2$ complex with CF$_3$-pyrazolyl-pyridine ligand]$_2$ | Chem. Mater. 17, 3532 (2005) |
| Ruthenium(II) complexes | [Ru(PPhMe$_2$)$_2$ complex with $^t$Bu-pyrazolyl-isoquinoline ligand]$_2$ | Adv. Mater. 17, 1059 (2005) |

TABLE 1-continued
| MATERIAL | EXAMPLES OF MATERIAL | PUBLICATIONS |
|---|---|---|
| Green dopants | | |
| Iridium(III) organometallic complexes | 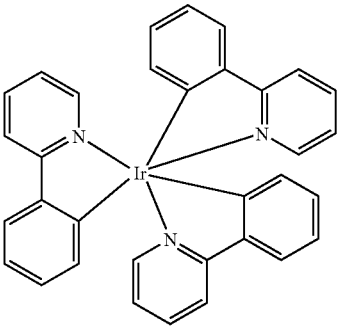<br>and its derivatives | Inorg. Chem. 40, 1704 (2001) |
| | 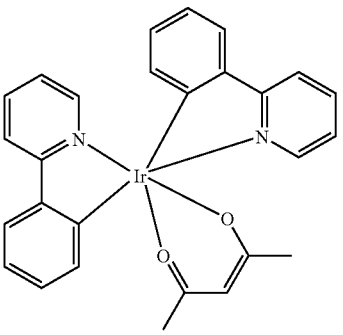 | US2002034656 |
| | 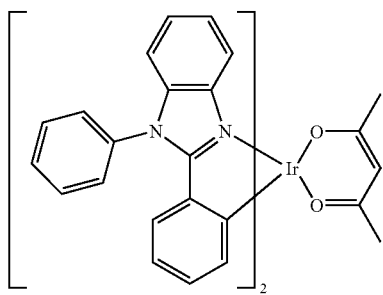 | US06687266 |
| | 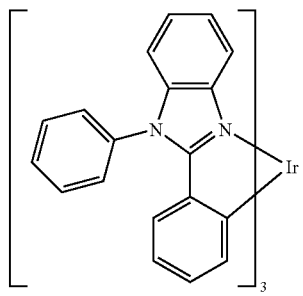 | Chem. Mater. 16, 2480 (2004) |

TABLE 1-continued

| MATERIAL | EXAMPLES OF MATERIAL | PUBLICATIONS |
|---|---|---|
| | | US2007190359 |
| | | US 2006008670<br>JP2007123392 |
| | | Adv. Mater.<br>16, 2003<br>(2004) |
| | | Angew. Chem.<br>Int. Ed.<br>2006, 45, 7800 |
| Pt(II) organometallic complexes | | Appl. Phys.<br>Lett. 86,<br>153505 (2005) |

TABLE 1-continued

| MATERIAL | EXAMPLES OF MATERIAL | PUBLICATIONS |
| --- | --- | --- |
|  |  | Appl. Phys. Lett. 86, 153505 (2005) |
|  |  | Chem. Lett. 34, 592 (2005) |
| Gold complexes |  | Chem. Commun. 2906 (2005) |
| Rhenium(III) complexes |  | Inorg. Chem. 42, 1248 (2003) |
| Blue dopants | | |
| Iridium(III) organometallic complexes |  | WO2002002714 |

TABLE 1-continued

| MATERIAL | EXAMPLES OF MATERIAL | PUBLICATIONS |
|---|---|---|
| | | WO2006009024 |
| | | US2006251923 |
| | | WO2006056418, US2005260441 |
| | | US2007190359 |
| | | US2002134984 |
| | | Angew. Chem. Int. Ed. 47, 1 (2008) |

TABLE 1-continued

| MATERIAL | EXAMPLES OF MATERIAL | PUBLICATIONS |
|---|---|---|
| | | Chem. Mater. 18, 5119 (2006) |
| | | Inorg. Chem. 46, 4308 (2007) |
| | | WO05123873 |
| | | WO05123873 |
| | | WO07004380 |

TABLE 1-continued

| MATERIAL | EXAMPLES OF MATERIAL | PUBLICATIONS |
| --- | --- | --- |
| | | WO06082742 |
| Osmium(II) complexes | | US2005260449 |
| | | Organometallics 23, 3745 (2004) |
| Gold complexes | | Appl. Phys. Lett. 74, 1361 (1999) |
| Platinum(II) complexes | | WO06098120, WO06103874 |

TABLE 1-continued
| MATERIAL | EXAMPLES OF MATERIAL | PUBLICATIONS |
|---|---|---|
| Exciton/hole blocking layer materials | | |
| Bathocuprine compounds (e.g., BCP, BPhen) | 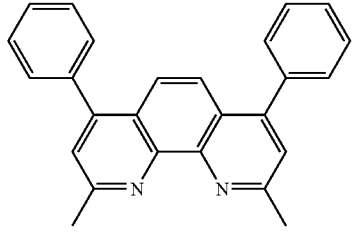 | Appl. Phys. Lett. 75, 4 (1999) |
| | 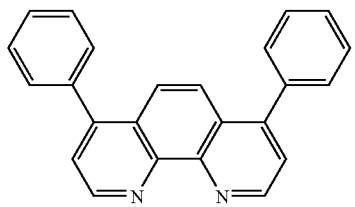 | Appl. Phys. Lett. 79, 449 (2001) |
| Metal 8-hydroxyquinolates (e.g., BAlq) | 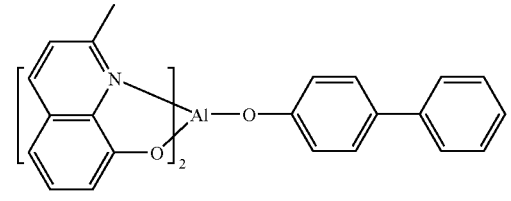 | Appl. Phys. Lett. 81, 162 (2002) |
| 5-member ring electron deficient heterocycles such as triazole, oxadiazole, imidazole, benzoimidazole | 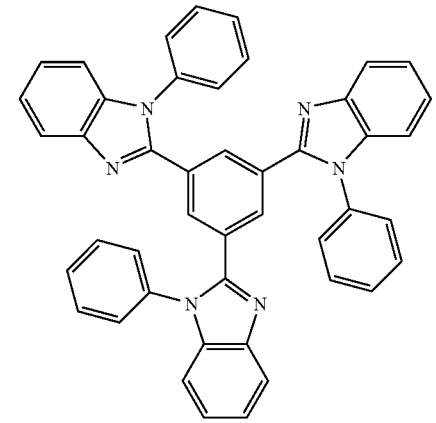 | Appl. Phys. Lett. 81, 162 (2002) |

TABLE 1-continued
| MATERIAL | EXAMPLES OF MATERIAL | PUBLICATIONS |
|---|---|---|
| Triphenylene compounds | 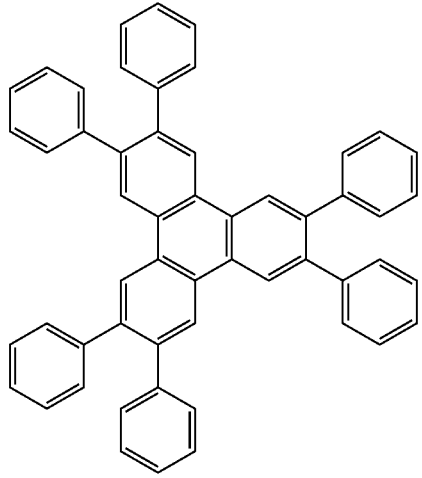 | US20050025993 |
| Fluorinated aromatic compounds | 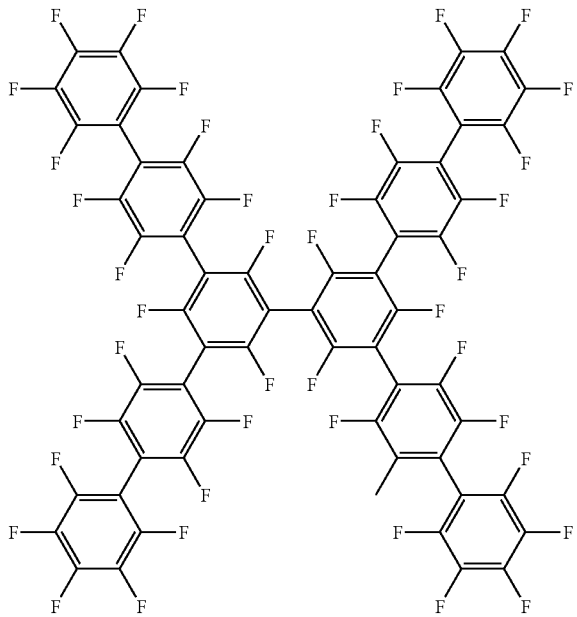 | Appl. Phys. Lett. 79, 156 (2001) |

TABLE 1-continued

| MATERIAL | EXAMPLES OF MATERIAL | PUBLICATIONS |
| --- | --- | --- |
| Electron transporting materials | | |
| Anthracene-benzoimidazole compounds | | WO03060956 |
| Anthracene-benzothiazole compounds | | Appl. Phys. Lett. 89, 063504 (2006) |
| Metal 8-hydroxyquinolates (e.g., Alq$_3$) | | Appl. Phys. Lett. 51, 913 (1987) |
| Metal hydroxybenoquinolates | | Chem. Lett. 5, 905 (1993) |
| Bathocuprine compounds such as BCP, BPhen, etc | | Appl. Phys. Lett. 91, 263503 (2007) |

TABLE 1-continued
| MATERIAL | EXAMPLES OF MATERIAL | PUBLICATIONS |
|---|---|---|
| | 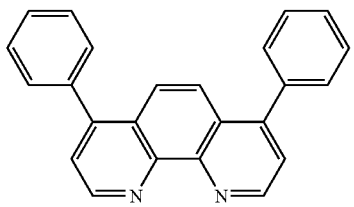 | Appl. Phys. Lett. 79, 449 (2001) |
| 5-member ring electron deficient heterocycles (e.g., triazole, oxadiazole, imidazole, benzoimidazole) | 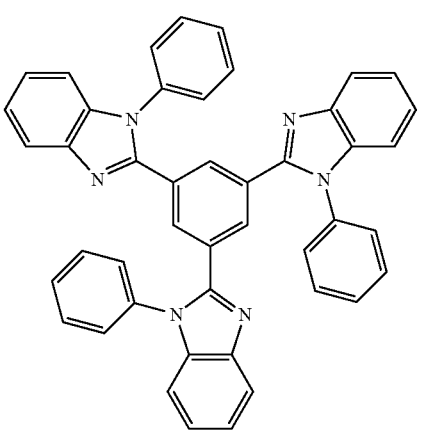 | Appl. Phys. Lett. 74, 865 (1999) |
| | 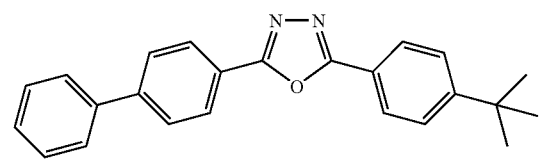 | Appl. Phys. Lett. 55, 1489 (1989) |
| | 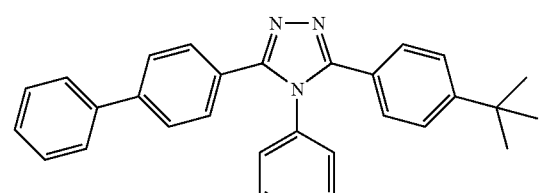 | Jpn. J. Apply. Phys. 32, L917 (1993) |
| Silole compounds | 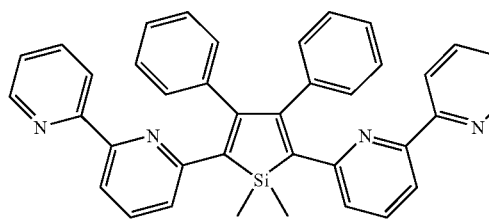 | Org. Electron. 4, 113 (2003) |

TABLE 1-continued

| MATERIAL | EXAMPLES OF MATERIAL | PUBLICATIONS |
| --- | --- | --- |
| Arylborane compounds | (structure) | J. Am. Chem. Soc. 120, 9714 (1998) |
| Fluorinated aromatic compounds | (structure) | J. Am. Chem. Soc. 122, 1832 (2000) |

EXAMPLES

A number of devices were fabricated by thermal evaporation of the various layers layers, in sequence, on a commercially available ITO coated substrate. Table 2 shows the structure of various devices fabricated. Where a thickness appears at the head of a column, the layer corresponding to that column had that thickness in all devices. All concentrations are wt %, and where a concentration for a particular material is not specified, the material makes up the remainder of the material in the layer for which a concentration is not already specified, i.e., Device 1 has ITO/A (100 wt %)/A (99.5 wt %):B (0.5 wt %)/and so on.

TABLE 2

Device structures

| Device No. | | [10 nm] | [20 nm] | [15 nm] | | [40 nm] | [90 nm] |
| --- | --- | --- | --- | --- | --- | --- | --- |
| 1 | ITO [80 nm] | A | A:B 0.5% | C:E 18% | D [5 nm] | LG201 | LiF/Al |
| 2 | ITO [80 nm] | A | A:B 1% | C:E 18% | D [5 nm] | LG201 | LiF/Al |
| 3 | ITO [80 nm] | A | A:B 1% | C:E 18% | D [5 nm] | LG201 | LiF/Al |
| 4 | ITO [120 nm] | A | A:B 0.5% | C:E 15% | D [5 nm] | LG201 | LiF/Al |
| 5 | ITO [120 nm] | A | A:B 0.5% | C:E 15% | C [5 nm] | LG201 | LiF/Al |
| 6 | ITO [120 nm] | A | A:B 0.5% | C:E 15% | | LG201 | LiF/Al |
| 7 | ITO [120 nm] | A | A:B 0.5% | C:F 18% | D [5 nm] | LG201 | LiF/Al |
| 8 | ITO [120 nm] | A | A:B 0.5% | C:F 18% | C [5 nm] | LG201 | LiF/Al |
| 9 | ITO [120 nm] | A | A:B 0.5% | C:F 18% | | LG201 | LiF/Al |
| 10 | ITO [120 nm] | A | A:B 0.5% | D:F 18% | D [5 nm] | LG201 | LiF/Al |
| 11 | ITO [120 nm] | A | A:B 0.5% | D:F 18% | C [5 nm] | LG201 | LiF/Al |
| 12 | ITO [120 nm] | A | A:B 0.5% | D:F 18% | | LG201 | LiF/Al |
| 13 | ITO [80 nm] | A | A:B 0.5% | C:E 15% | D [5 nm] | LG201 | LiF/Al |
| 14 | ITO [80 nm] | A | A:B 0.5% | C:E 15% | C [5 nm] | LG201 | LiF/Al |
| 15 | ITO [80 nm] | A | A:B 0.5% | C:E 15% | | LG201 | LiF/Al |
| 16 | ITO [80 nm] | A | A:B 0.5% | C:F 18% | D [5 nm] | LG201 | LiF/Al |
| 17 | ITO [80 nm] | A | A:B 0.5% | C:F 18% | C [5 nm] | LG201 | LiF/Al |

TABLE 2-continued

| Device No. | Device structures | | | | | |
|---|---|---|---|---|---|---|
| | [10 nm] | [20 nm] | [15 nm] | | [40 nm] | [90 nm] |
| 18 | ITO [80 nm] | A | A:B 0.5% | C:F 18% | | LG201 | LiF/Al |
| 19 | ITO [80 nm] | A | A:B 0.5% | D:F 18% | D [5 nm] | LG201 | LiF/Al |
| 20 | ITO [80 nm] | A | A:B 0.5% | D:F 18% | C [5 nm] | LG201 | LiF/Al |
| 21 | ITO [80 nm] | A | A:B 0.5% | D:F 18% | | LG201 | LiF/Al |
| 22 | ITO [120 nm] | A | A:B 0.5% | C:E 15% | C [5 nm] | LG201 | LiF/Al |
| 23 | ITO [120 nm] | A | A:B 0.5% | C:E:A 15%:0.5% | C [5 nm] | LG201 | LiF/Al |
| 24 | ITO [120 nm] | A | A:B 0.5% | C:E:A 15%:0.5% | C [5 nm] | LG201 | LiF/Al |

Devices 25 and 26, which are not included in the table due to different layer thicknesses, had the following structures:

Device 25: ITO(120 nm)/A(10 nm)/A:B[0.5%](20 nm)/mCBP:G [15%](15 nm)/mCBP(5 nm)/LG201(30 mm)/LiF/Al Device 26: ITO(120 nm)/H(30 nm)/NPD(10 nm)/A:B[0.5%](20 nm)/mCBP:G[15%](15 nm)/mCBP 5 nm)/LG201(30 nm)/LiF/Al Table 3 shows measured device performance characteristics for the devices described in Table 2. Voltage, luminous efficacy (in candelas per amp), external quantum efficiency, and power efficiency were measured at a luminance of 1000 nits. 1931 CIE coordinates were measured at a current density of 10 mA/cm$^2$.

TABLE 3

Device Performance Characteristics

| | At 1000 nits. | | | | At 10 mA/cm$^2$ | |
|---|---|---|---|---|---|---|
| Device No. | Voltage [V] | Luminous Efficacy cd/A | EQE [%] | Power Efficiency [Lm/W] | 1931 CIE x | 1931 CIE y |
| 1 | 4.5 | 33.1 | 16.7 | 22.9 | 0.442 | 0.443 |
| 2 | 4.5 | 33.8 | 17.8 | 23.6 | 0.456 | 0.434 |
| 3 | 4.5 | 25.7 | 13.2 | 17.9 | 0.437 | 0.445 |
| 4 | 4.3 | 34.3 | 16.1 | 25.3 | 0.416 | 0.429 |
| 5 | 5.0 | 17.4 | 8.1 | 10.8 | 0.407 | 0.429 |
| 6 | 5.1 | 6.4 | 3.0 | 4.0 | 0.402 | 0.427 |
| 7 | 4.3 | 43.3 | 18.8 | 31.4 | 0.424 | 0.475 |
| 8 | 4.7 | 31.8 | 13.7 | 21.3 | 0.415 | 0.476 |
| 9 | 4.5 | 15.4 | 6.4 | 10.6 | 0.388 | 0.487 |
| 10 | 4.8 | 28.7 | 13.7 | 18.9 | 0.473 | 0.450 |
| 11 | 5.1 | 21.2 | 10.2 | 13.1 | 0.480 | 0.447 |
| 12 | 4.5 | 20.5 | 9.5 | 14.4 | 0.455 | 0.456 |
| 13 | 4.3 | 32.4 | 17.0 | 23.7 | 0.395 | 0.395 |
| 14 | 5.1 | 17.4 | 9.0 | 10.8 | 0.379 | 0.393 |
| 15 | 5.2 | 7.0 | 3.6 | 4.2 | 0.378 | 0.391 |
| 16 | 4.6 | 36.0 | 17.3 | 24.5 | 0.414 | 0.454 |
| 17 | 5.1 | 29.9 | 14.1 | 18.4 | 0.396 | 0.455 |
| 18 | 4.8 | 18.3 | 8.6 | 12.0 | 0.393 | 0.456 |
| 19 | 5.2 | 21.0 | 10.7 | 12.6 | 0.444 | 0.438 |
| 20 | 5.6 | 18.4 | 9.4 | 10.3 | 0.450 | 0.437 |
| 21 | 4.9 | 16.8 | 8.5 | 10.8 | 0.442 | 0.439 |
| 22 | 4.6 | 10.7 | 5.1 | 7.3 | 0.422 | 0.423 |
| 23 | 4.6 | 11.7 | 5.0 | 7.9 | 0.423 | 0.463 |
| 24 | 4.5 | 14.3 | 5.5 | 9.9 | 0.402 | 0.493 |
| 25 | 4.9 | 16.7 | 9.3 | 10.6 | 0.280 | 0.310 |
| 26 | 5.3 | 14.9 | 8.3 | 8.7 | 0.323 | 0.322 |

The measured device results show that devices having a combination of first emissive and non-emissive layers sharing a common first non-emissive material, and second emissive and non-emissive layer sharing a common second non-emissive material, show results unexpectedly superior to devices lacking the second non-emissive layer. All devices in Tables 2 and 3, with the exception of Device 26 which is a comparative example, have a first emissive layer that is 20 nm non-emitting Compound A doped with 0.5 wt % emitting Compound B, and a first non-emissive layer that is 10 nm of Compound A, where Compound A is the first non-emitting material that is common to the two layers. Some of the devices, specifically Device Nos. 5, 10, 14, 17, 19, 22, 23, and 24 also have a second emissive layer that is 15 nm of either non-emitting Compound C or D doped with emitting Compounds E, F and/or A, and a second non-emissive layer that is 5 nm of Compound C or D, where Compound C or D is the second non-emitting material that is common to the two layers. Other devices in the table use a non-emitting material in the second non-emissive layer that is different from the non-emitting material in the second emitting layer, or lack the second non-emissive layer.

By comparing Device Nos. 5, 10, 14, 17 and 19 to Device Nos. 6, 12, 15, 18 and 21, respectively, it can be seen that the addition of a second non-emissive layer made of the same non-emitting material that is present in the second emissive layer dramatically improves device external quantum efficiency and power efficiency.

It should also be noted that Compound D appears to be a better electron transport material than Compound C across various devices in Tables 2 and 3. The specific comparisons noted in the prior paragraph control for and remove effects caused by one specific material being better than another specific material, and isolate the effect caused by using a second non-emissive layer comprising the same non-emitting material as the second emissive layer.

Comparing Device No. 25 and 26 shows that the use of a first non-emissive layer comprising a first non-emitting material, which is also used in an adjacent emissive layer comprising the first non-emitting material and a first emitting material, as in Device No. 25, may provide superior efficiency as compared to an otherwise identical device that uses a common hole-injection/hole transport material selection (Device No. 26).

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples

The invention claimed is:

1. An organic light emitting device, comprising:
an anode;
a cathode;
a first emissive layer disposed between the anode and the cathode, the first emissive layer comprising:
  a first non-emitting organic material, wherein the first non-emitting material is organometallic and is present in the first emissive layer in a concentration of at least 50 wt %; and
  a first emitting organic material;
a second emissive layer disposed between the first emissive layer and the cathode, and in direct contact with the first emissive layer, the second emissive layer comprising:
  a second non-emitting organic material; and
  a second emitting organic material;
a first non-emissive layer disposed between the first emissive layer and the anode, and in direct contact with the first emissive layer, the first non-emissive layer comprising the first non-emitting organic material.

2. The device of claim 1, further comprising a second non-emissive layer disposed between the second emissive layer and the cathode, and in direct contact with the second emissive layer, the second non-emissive layer comprising the second non-emitting organic material.

3. The device of claim 2, wherein the first and second emitting organic materials are phosphorescent materials.

4. The device of claim 2, wherein the first emitting organic material is present in the first emissive layer in a concentration of 0.1 to 6 wt %.

5. The device of claim 4, wherein the first emitting organic material is present in the first emissive layer in a concentration of 0.1 to 3 wt %.

6. The device of claim 2, wherein:
the first emissive layer consists essentially of the first non-emitting organic material and the first emitting organic material;
the first non-emissive layer consists essentially of the first non-emitting organic material;
the second emissive layer consists essentially of the second non-emitting organic material and the second emitting organic material;
the second non-emissive layer consists essentially of the second non-emitting organic material.

7. The device of claim 6, further comprising a third non-emissive layer disposed between the second non-emissive layer and the cathode, and in direct contact with the second non-emissive layer and the cathode, the third non-emissive layer comprising a third non-emitting material.

8. The device of claim 7, wherein the third non-emissive layer consists essentially of a third non-emitting material.

9. The device of claim 8, wherein the first non-emissive layer is in direct contact with the anode.

10. The device of claim 9, wherein the device consists essentially of the anode, the cathode, the first and second emitting materials, and the first, second and third non-emitting materials.

11. The device of claim 2, wherein the second emissive layer further comprises a fourth non-emitting material.

12. The device of claim 2, wherein the first emitting material has a peak emissive wavelength in the visible spectrum of 500-700 nm, and the second emitting material has a peak emissive wavelength in the visible spectrum of 400-500 nm.

* * * * *